(12) United States Patent
Moriwaki et al.

(10) Patent No.: US 6,812,101 B2
(45) Date of Patent: Nov. 2, 2004

(54) SEMICONDUCTOR DEVICE AND METHOD FOR MANUFACTURE THEREOF

(75) Inventors: Masaru Moriwaki, Neyagawa (JP); Masaaki Niwa, Osaka (JP); Masafumi Kubota, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/332,519

(22) PCT Filed: Feb. 6, 2002

(86) PCT No.: PCT/JP02/00997
§ 371 (c)(1),
(2), (4) Date: Jan. 10, 2003

(87) PCT Pub. No.: WO02/082554
PCT Pub. Date: Oct. 17, 2002

(65) Prior Publication Data
US 2003/0173586 A1 Sep. 18, 2003

(51) Int. Cl.⁷ .................. H01L 21/336; H01L 29/76
(52) U.S. Cl. ....................... 438/287; 257/410
(58) Field of Search .................. 257/410; 438/287

(56) References Cited

U.S. PATENT DOCUMENTS

| | | | |
|---|---|---|---|
| 6,020,243 A | 2/2000 | Wallace et al. | |
| 6,027,961 A | 2/2000 | Maiti et al. | |
| 6,203,613 B1 | 3/2001 | Gates et al. | |
| 6,391,803 B1 * | 5/2002 | Kim et al. | 438/787 |
| 2002/0106536 A1 * | 8/2002 | Lee et al. | 428/702 |

FOREIGN PATENT DOCUMENTS

| | | |
|---|---|---|
| EP | 1028458 A2 | 8/2000 |
| GB | 2340508 A | 2/2000 |
| JP | 11-135774 A | 5/1999 |
| JP | 2000-188338 A | 7/2000 |
| JP | 2000-188400 A | 7/2000 |
| JP | 2000-307010 A | 11/2000 |
| JP | 2000-315789 | 11/2000 |
| JP | 2000340670 * | 12/2000 |

OTHER PUBLICATIONS

Dae–Gyu Park et al., "Boron penetration in p⁺ polycrystalline–Si/Al₂O₃/Si metal–oxide–semiconductor system," Applied Physics Letters, vol. 77, No. 14, Oct. 2000.

G.D. Wilk and R.M. Wallace, Electrical properties of hafnium silicate gete dielectrics deposited directly on silicon, Applied Physics Letters, May 10, 1999, vol. 74, No. 19, pp. 2854 to 2856.

Dae–Gyu Park et al., Characteristics of Al2O3 Gate Dielectric Prepared by Atomic Layer Deposition for Giga Scale CMOS DRAM Devices, 2000 Symposium on VLSI Technology Digest of Technical Papers, 2000, pp. 46 to 47.

H.J. Osten et al., "High–k gate dielectrics with ultra–low leaking current based on praseodymium oxide", International Electron Devices Meeting 2000, Technical Digest, Dec. 10–13, 2000, pp. 653–656.

* cited by examiner

*Primary Examiner*—Douglas Wille
(74) *Attorney, Agent, or Firm*—McDermott Will & Emery LLP (57) ABSTRACT

A zirconium silicate layer 103 is formed on a silicon substrate 100, a zirconium oxide layer 102 is also formed on the zirconium silicate layer 103, and the zirconium oxide layer 102 is then removed, thereby forming a gate insulating film 104 made of the zirconium silicate layer 103.

34 Claims, 6 Drawing Sheets

SEMICONDUCTOR DEVICE AND METHOD FOR MANUFACTURE THEREOF

TECHNICAL FIELD

The present invention relates to semiconductor devices having gate insulating films made of a high dielectric constant material, and to methods for fabricating the same.

BACKGROUND ART

With recent advances in techniques for enabling increased degrees of integration in and high-speed operation of semiconductor devices, MOSFETs (metal oxide semiconductor field effect transistors) have decreased in size. Along with this decrease in MOSFET size, gate insulating films have become progressively thinner, and as a result, the problem of enlarged gate leakage current due to tunnel current has become manifest. To address the problem, techniques have been studied for realizing a gate insulating film having a capacity equivalent to that of a thin $SiO_2$ film (that is, a small equivalent oxide ($SiO_2$) thickness, hereinafter referred to as "EOT") and having a large physical film thickness (meaning a small leakage current), by using, as a material for the gate insulating film, a high-k material having a dielectric constant higher than that of $SiO_2$ (hereinafter referred to as a "high-dielectric-constant material"). Specific examples of such a high-dielectric-constant material include an insulating metal oxide such as $HfO_2$ or $ZrO_2$.

In addition, lately, multi-function circuits, such as internal circuits for performing computational operations, peripheral circuits for carrying out input and output, and DRAMs (dynamic random access memories), have been generally integrated on a single chip set out as a system LSI. As components of such a system LSI, MOSFETs that, in accordance with their functions, have enhanced driving power even though their leakage current is large, or have decreased leakage current even though their driving power is low are being sought. Being used in this regard is technology by which the $SiO_2$ films that serve as gate insulating films in MOSFETs are varied in thickness on the basis of the MOSFET functions,—specifically, multi-gate insulating film technology for forming gate insulating films with differing thicknesses.

When a high-dielectric-constant material is used as a material for a gate insulating film, however, it is difficult to obtain a desired EOT even though increase in the gate leakage current can be prevented.

Further, there is also a problem with the multi-gate insulating film technology, in that the gate leakage current is increased owing to the small thickness of the gate insulating films.

DISCLOSURE OF INVENTION

In view of the foregoing, a first object of the present invention is to realize a gate insulating film with small EOT and small leakage current, and a second object thereof is to prevent increase in gate leakage current when multi-gate insulating film technology is used.

To achieve the objects, the present inventors investigated the cause of the failure to realize a desired EOT even when a high-dielectric-constant material (specifically, a metal oxide) is used as a material for a gate insulating film, and the following has been made clear.

Specifically, when a metal oxide layer which serves as a gate insulating film is formed on a silicon substrate, an insulating compound layer (hereinafter, referred to as a "metal silicate layer) made of the three elements of silicon, oxygen and a metal contained in the metal oxide layer forms between the silicon substrate and the metal oxide layer. In other words, a gate insulating film is formed out of the multilayer structure of the metal silicate layer and the metal oxide layer. In this case, the dielectric constant of the metal silicate layer is lower than the dielectric constant of the metal oxide layer, thus decreasing the effective dielectric constant of the entire gate insulating film. As a result, a gate insulating film having a desired EOT cannot be formed, and therefore a MOSFET having such high driving power as expected cannot be realized, that is, the performance of the MOSFET cannot be enhanced.

Figure 6:
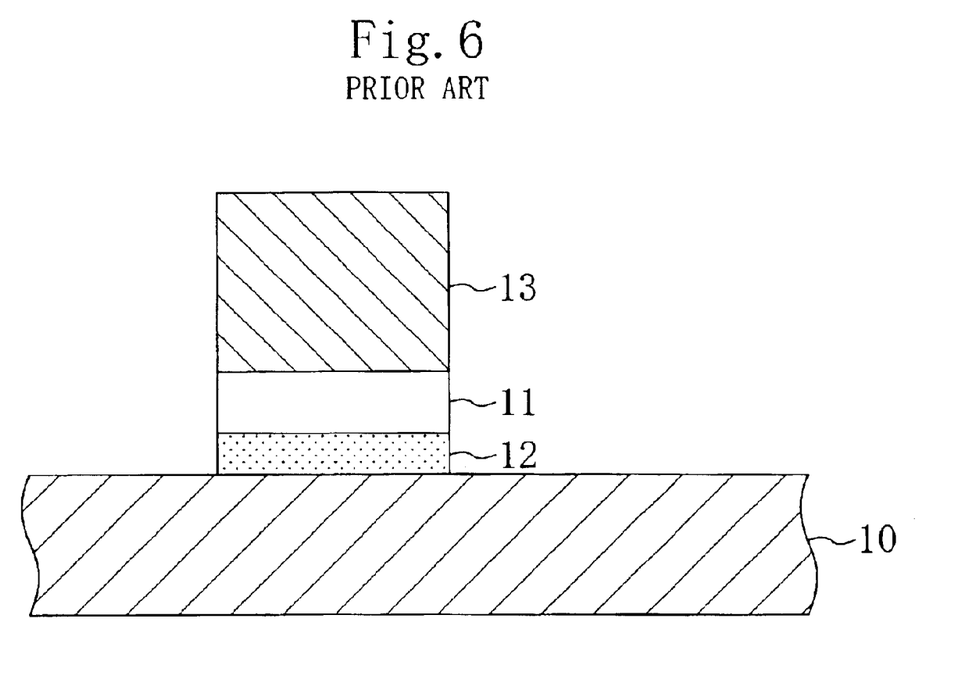
FIG. 6 is a cross-sectional view illustrating a known semiconductor device.

FIG. 6 is a cross-sectional view illustrating a known semiconductor device, specifically a known MOSFET in which zirconium oxide ($ZrO_2$) is used as a high-dielectric-constant material constituting a gate insulating film.

As shown in FIG. 6, a zirconium oxide layer 11, which serves as a gate insulating film, is formed on a silicon substrate 10. At this time, however, a zirconium silicate layer 12 forms between the silicon substrate 10 and the zirconium oxide layer 11. Accordingly, a gate electrode 13 will be formed on the gate insulating film made of the multilayer structure of the zirconium oxide layer 11 and the zirconium silicate layer 12.

Meanwhile, the present inventors found that when a metal oxide layer, which acts as a high-dielectric-constant material layer, is formed on a silicon substrate by, e.g., reactive sputtering, a metal silicate layer having a uniform thickness of about 2 through 3 nm and having a dielectric constant higher than the dielectric constant of a $SiO_2$ film can be formed between the silicon substrate and the metal oxide layer by controlling particles sputtered from the target and implanted into the substrate surface, or by controlling the $O_2$ plasma generated during the sputtering. They also found that by using the metal silicate layer as a gate insulating film, that is, by forming the metal oxide layer and the metal silicate layer and subsequently removing the metal oxide layer, the first object can be achieved, that is, a gate insulating film with small EOT and small leakage current can be realized. Note that when chemical vapor deposition, for example, is used instead of the reactive sputtering to form a metal silicate layer, such a quality metal silicate layer as mentioned above can also be formed.

The present inventors also found the following. When another metal oxide layer is formed on the metal silicate layer after the metal oxide layer has been removed, said another metal oxide layer can be formed as designed without taking reaction with the substrate into account; thus by using the multilayer structure of the metal silicate layer and said another metal oxide layer as a gate insulating film, the first object can also be achieved.

The present inventors further found that by forming a metal oxide layer and a metal silicate layer, and then partially removing the metal oxide layer, multi-gate insulating film technology in which the single layer structure of the metal silicate layer is used as a thin gate insulating film and the multilayer structure of the metal silicate layer and the metal oxide layer is used as a thick gate insulating film can be realized. This enables the second object to be achieved, that is, the gate leakage current can be controlled when the multi-gate insulating film technology is used. In this case, the multilayer structure of the metal silicate layer and another metal oxide layer may also be used as a thin gate insulating film.

The present invention was made based on the above-described findings. Specifically, in order to achieve the first object, a first inventive method for fabricating a semiconductor device includes the steps of: (a) forming a metal silicate layer containing at least a first metal on a silicon substrate, and also forming a metal oxide layer containing the first metal on the metal silicate layer; (b) removing the metal oxide layer, thereby forming a gate insulating film made of the metal silicate layer; and (c) forming a gate electrode on the gate insulating film.

According to the first inventive method for fabricating a semiconductor device, a metal silicate layer and a metal oxide layer both containing a first metal are sequentially formed on a silicon substrate, and the metal oxide layer is then removed, thereby forming a gate insulating film made of the metal silicate layer. In this method, a metal silicate layer with a uniform thickness and a dielectric constant higher than that of $SiO_2$ can be formed by a reactive sputtering method or by a chemical vapor deposition method, for example, and the thickness of the metal silicate layer can be easily adjusted by controlling the sputtering conditions or the deposition conditions, for example. Accordingly, it is possible to obtain a gate insulating film with small EOT and small leakage current, enabling realizing a low-power-consumption MOSFET having desired driving power.

In order to achieve the first object, a second inventive method for fabricating a semiconductor device includes the steps of: (a) forming a metal silicate layer containing at least a first metal on a silicon substrate, and also forming a metal oxide layer containing the first metal on the metal silicate layer; (b) removing the metal oxide layer, and then forming another metal oxide layer containing a second metal different from the first metal over the silicon substrate, thereby forming a gate insulating film made of the metal silicate layer and said another metal oxide layer; and (c) forming a gate electrode on the gate insulating film.

According to the second inventive method for fabricating a semiconductor device, a metal silicate layer and a metal oxide layer both containing a first metal are sequentially formed on a silicon substrate, the metal oxide layer is then removed, and thereafter another metal oxide layer containing a second metal different form the first metal is formed, thereby forming a gate insulating film made of the metal silicate layer and said another metal oxide layer. In this method, a metal silicate layer with a uniform thickness and a dielectric constant higher than that of $SiO_2$ can be formed by a reactive sputtering method or by a chemical vapor deposition method, for example, and the thickness of the metal silicate layer can be easily adjusted by controlling the sputtering conditions or the deposition conditions, for example. Further, since said another metal oxide layer is separately formed on the metal silicate layer, said another metal oxide layer can be formed as designed without taking reaction with the silicon substrate into account. Accordingly, with the multilayer structure of the metal silicate layer and said another metal oxide layer, a gate insulating film with small EOT and small leakage current can be realized, which enables realizing a low-power-consumption MOSFET having desired driving power.

Moreover, according to the second inventive method for fabricating a semiconductor device, the multilayer structure of the metal silicate layer and said another metal oxide layer can be easily formed to have a desired thickness configuration. This enables the design of a gate insulating film in accordance with the functions called for in a MOSFET. For example, designing a gate insulating film targeted at compatibility between high driving power and lower power consumption is facilitated.

Furthermore, in the second inventive method for fabricating a semiconductor device, the first metal is preferably selected in such a manner that the metal silicate layer is thermally stable at the interface with the substrate and does not cause creation of great strain in the silicon crystal, which would result in deterioration of mobility in the silicon crystal. In addition, the second metal is preferably selected in such a manner that the dielectric constant of said another metal oxide layer containing the second metal is higher than the dielectric constant of the metal oxide layer containing the first metal.

In order to achieve the second object, a third inventive method for fabricating a semiconductor device includes the steps of: (a) forming a metal silicate layer containing at least a first metal in a first device-formation region and a second device-formation region on a silicon substrate, and also forming a metal oxide layer containing the first metal on the metal silicate layer; (b) removing part of the metal oxide layer located in the first device-formation region, thereby forming a first gate insulating film made of the metal silicate layer in the first device-formation region, and also forming a second gate insulating film made of the metal silicate layer and the metal oxide layer in the second device-formation region; and (c) forming a first gate electrode on the first gate insulating film, and also forming a second gate electrode on the second gate insulating film.

According to the third inventive method for fabricating a semiconductor device, a metal silicate layer and a metal oxide layer both containing a first metal are sequentially formed on a silicon substrate, and the metal oxide layer is then partially removed, thereby forming a first gate insulating film made of the metal silicate layer, and a second gate insulating film made of the metal silicate layer and the metal oxide layer. In other words, the third inventive method for fabricating a semiconductor device is multi-gate insulating film technology in which the single layer structure of the metal silicate layer is used as a thin gate insulting film, and the multilayer structure of the metal silicate layer and the metal oxide layer is used as a thick gate insulating film. Also, in the third inventive method for fabricating a semiconductor device, a metal silicate layer with a uniform thickness and a dielectric constant higher than that of $SiO_2$ can be formed by a reactive sputtering method or by a chemical vapor deposition method, for example, and the thickness of the metal silicate layer can be easily adjusted by controlling the sputtering conditions or the deposition conditions, for example. Accordingly, because small EOT and small leakage current can be realized in the thin gate insulating film (the first gate insulating film), increase in the gate leakage current can be prevented when the multi-gate insulating film technology is used, enabling the formation of a low-power consumption system LSI. Further, the first gate insulating film enables realizing a MOSFET in which priority is given to increase in the driving power, while the second gate insulating film enables realizing a MOSFET in which priority is given to decrease in the consumption power. As a result, a system LSI in which high driving power and low power consumption are compatible with each other can be realized.

In order to achieve the second object, a fourth inventive method for fabricating a semiconductor device includes the steps of (a) forming a metal silicate layer containing at least a first metal in a first device-formation region and a second device-formation region on a silicon substrate, and also forming a metal oxide layer containing the first metal on the metal silicate layer; (b) removing part of the metal oxide layer located in the first device-formation region, and then forming another metal oxide layer containing a second metal different from the first metal over the first device-formation region and the second device-formation region, thereby forming in the first device-formation region a first gate insulating film made of the metal silicate layer and said another metal oxide layer, and also forming in the second device-formation region a second gate insulating film made of the metal silicate layer, the metal oxide layer and said another metal oxide layer; and (c) forming a first gate electrode on the first gate insulating film, and also forming a second gate electrode on the second gate insulating film.

According to the fourth inventive method for fabricating a semiconductor device, a metal silicate layer and a metal oxide layer both containing a first metal are sequentially formed on a silicon substrate, the metal oxide layer is then partially removed, and thereafter another metal oxide layer containing a second metal different from the first metal is formed, thereby forming a first gate insulating film made of the metal silicate layer and said another metal oxide layer, and a second gate insulating film made of the metal silicate layer, the metal oxide layer and said another metal oxide layer. In other words, the fourth inventive method for fabricating a semiconductor device is multi-gate insulating film technology in which the multilayer structure of the metal silicate layer and said another metal oxide layer is used as a thin gate insulting film, and the multilayer structure of the metal silicate layer, the metal oxide layer and said another metal oxide layer is used as a thick gate insulating film. Also, in the fourth inventive method for fabricating a semiconductor device, a metal silicate layer with a uniform thickness and a dielectric constant higher than that of $SiO_2$ can be formed by a reactive sputtering method or by a chemical vapor deposition method, for example, and the thickness of the metal silicate layer can be easily adjusted by controlling the sputtering conditions or the deposition conditions, for example. Further, in the fourth inventive method for fabricating a semiconductor device, since said another metal oxide layer is separately formed on the metal silicate layer or the metal oxide layer, said another metal oxide layer can be formed as designed without taking reaction with the silicon substrate into account. Accordingly, because the multilayer structure of the metal silicate layer and said another metal oxide layer allows small EOT and small leakage current to be realized in the thin gate insulating film (the first gate insulating film), increase in the gate leakage current can be prevented when the multi-gate insulating film technology is used, enabling the formation of a low-power consumption system LSI. Further, with the first gate insulating film, a MOSFET in which priority is given to increase in the driving power can be realized, while with the second gate insulating film, a MOSFET in which priority is given to decrease in the consumption power can be realized. As a result, a system LSI in which high driving power and low power consumption are compatible with each other can be realized.

Moreover, according to the fourth inventive method for fabricating a semiconductor device, the multilayer structure of the metal silicate layer and said another metal oxide layer, or the multilayer structure of the metal silicate layer, the metal oxide layer and said another metal oxide layer can be easily formed to have a desired thickness configuration. This enables the design of a gate insulating film in accordance with the functions called for in a MOSFET. For example, designing a gate insulating film targeted at compatibility between high driving power and lower power consumption is facilitated.

Furthermore, in the fourth inventive method for fabricating a semiconductor device, the first metal is preferably selected in such a manner that the metal silicate layer is thermally stable at the interface with the substrate and does not cause creation of great strain in the silicon crystal, which would result in deterioration of mobility in the silicon crystal. In addition, the second metal is preferably selected in such a manner that the dielectric constant of said another metal oxide layer containing the second metal is higher than the dielectric constant of the metal oxide layer containing the first metal.

In the first through fourth inventive methods for fabricating a semiconductor device, the step (a) preferably includes the step (d) of forming the metal silicate layer and the metal oxide layer by reactive sputtering in which a target containing at least the first metal is used.

It is then ensured that a metal silicate layer with a uniform thickness and a dielectric constant higher than that of $SiO_2$ can be formed, and the thickness of the metal silicate layer can be accurately adjusted by controlling the sputtering conditions.

In the first through fourth inventive methods for fabricating a semiconductor device, the step (a) preferably includes the step (e) of forming the metal silicate layer and the metal oxide layer by chemical vapor deposition in which a source gas containing at least the first metal is used.

It is then ensured that a metal silicate layer with a uniform thickness and a dielectric constant higher than that of $SiO_2$ can be formed, and the thickness of the metal silicate layer can be accurately adjusted by controlling the deposition conditions.

In this case, the step (e) preferably includes the step of forming the metal oxide layer in molecular strata deposited one after another by pulsed supply of the source gas.

Then, the controllability and uniformity of the thickness of the metal silicate layer can be improved.

In the first through fourth inventive methods for fabricating a semiconductor device, the first metal is preferably one metal among the group of metals consisting of Hf, Zr, Ti, Ta, Al, Pr, Nd and La, or an alloy made of two or more metals among the group of metals.

This ensures that the dielectric constant of the metal silicate layer is higher than the dielectric constant of $SiO_2$. Also, the first metal is particularly preferably Zr in the first or third inventive method for fabricating a semiconductor device, while in the second or fourth inventive method for fabricating a semiconductor device, the first metal is particularly preferably Zr and the second metal is particularly preferably Hf.

In order to achieve the first object, a first inventive semiconductor device includes a MOSFET including a gate insulating film formed by sequentially stacking a metal silicate layer containing a first metal and a metal oxide layer containing a second metal different from the first metal.

Specifically, the first inventive semiconductor device is that formed by the second inventive method for fabricating a semiconductor device. In the first inventive semiconductor device, a gate insulating film with small EOT and small leakage current can be realized, enabling realizing a low-power-consumption MOSFET having desired driving power. It is also possible to facilitate the design of a gate insulating film in accordance with the functions called for in a MOSFET.

In order to achieve the second object, a second inventive semiconductor device includes a first MOSFET including a first gate insulating film made of a metal silicate layer containing a first metal, and a second MOSFET including a second gate insulating film formed by sequentially stacking the metal silicate layer and a metal oxide layer containing the first metal.

Specifically, the second inventive semiconductor device is that formed by the third inventive method for fabricating a semiconductor device. In the second inventive semiconductor device, increase in the gate leakage current can be prevented when the multi-gate insulating film technology is used, enabling the formation of a low-power consumption system LSI. Further, priority can be given to increase in the driving power in the first MOSFET including the first gate insulating film, while priority can be given to decrease in the consumption power in the second MOSFET including the second gate insulating film. As a result, a system LSI in which high driving power and low power consumption are compatible with each other can be realized.

In order to achieve the second object, a third inventive semiconductor device includes: a first MOSFET including a first gate insulating film formed by sequentially stacking a metal silicate layer containing a first metal and a metal oxide layer containing a second metal different from the first metal; and a second MOSFET including a second gate insulating film formed by sequentially stacking the metal silicate layer, a metal oxide layer containing the first metal, and the metal oxide layer containing the second metal.

Specifically, the third inventive semiconductor device is that formed by the fourth inventive method for fabricating a semiconductor device. In the third inventive semiconductor device, increase in the gate leakage current can be prevented when the multi-gate insulating film technology is used, enabling the formation of a low-power consumption system LSI. Further, priority can be given to increase in the driving power in the first MOSFET including the first gate insulating film, while priority can be given to decrease in the consumption power in the second MOSFET including the second gate insulating film. As a result, a system LSI in which high driving power and low power consumption are compatible with each other can be realized. In addition, it is possible to facilitate the design of a gate insulating film in accordance with the functions called for in a MOSFET.

In the first through third inventive semiconductor devices, the first metal is preferably one metal among the group of metals consisting of Hf, Zr, Ti, Ta, Al, Pr, Nd and La, or an alloy made of two or more metals among the group of metals.

It is then ensured that the dielectric constant of the metal silicate layer is higher than the dielectric constant of $SiO_2$.

In the second or third inventive semiconductor device, the first MOSFET is preferably used in an internal circuit, while the second MOSFET is preferably used in a peripheral circuit.

It is then possible to realize a system LSI including a high-driving-power, low-power-consumption internal circuit and a low-power-consumption peripheral circuit.

In the second or third inventive semiconductor device, the first MOSFET is preferably used in a logic section, while the second MOSFET is preferably used in a DRAM section.

It is then possible to realize a system LSI including a high-driving-power, low-power-consumption logic section and a low-power-consumption DRAM section.

BEST MODE FOR CARRYING OUT THE INVENTION

First Embodiment

Hereafter, taking an n-type MOSFET as an example, a semiconductor device in accordance with a first embodiment of the present invention and a method for fabricating the same will be described with reference to the accompanying drawings.

Figure 1A:
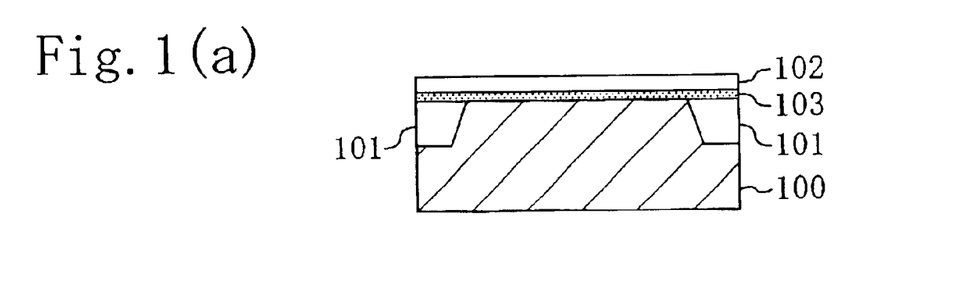
FIGS. 1(a) through 1(c) are cross-sectional views illustrating process steps of a method for fabricating a semiconductor device in accordance with a first embodiment of the present invention.
Figure 1B:
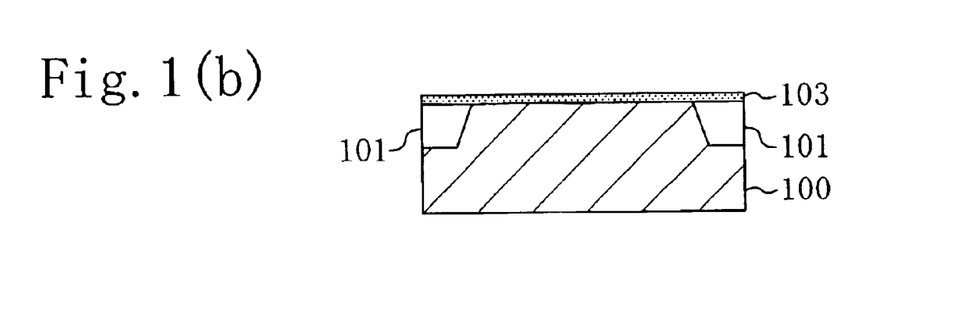
Figure 1C:
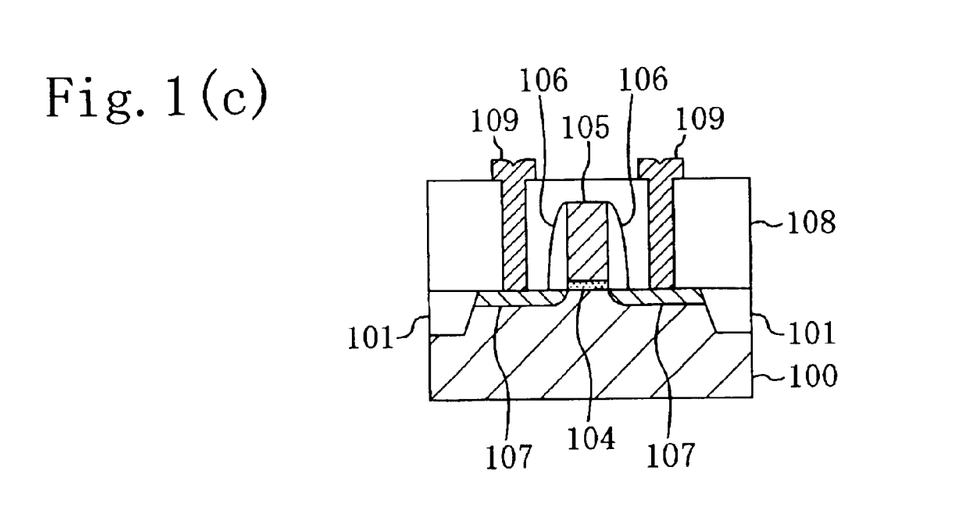

FIGS. 1(a) through 1(c) are cross-sectional views illustrating process steps of a method for fabricating the semiconductor device in the first embodiment.

The semiconductor device fabrication method in the first embodiment is characterized as follows: a metal silicate layer is formed on a silicon substrate, a metal oxide layer is also formed on the metal silicate layer, and the metal oxide layer is then removed, thereby forming a gate insulating film made of the metal silicate layer. In the first embodiment, a reactive sputtering method, for example, is used to form the metal silicate layer and the metal oxide layer.

Specifically, as shown in FIG. 1(a), an isolation 101 is formed in, e.g., a p-type silicon substrate 100 by a known method. A metal target made of, e.g., zirconium (Zr) is then subjected to a reactive sputtering performed in a gaseous mixture of, e.g., Ar and $O_2$ gases, thereby depositing on the silicon substrate 100 a zirconium oxide layer ($ZrO_2$ layer) 102 with a thickness of, e.g., some 5 nm as a high-dielectric-constant material layer. At this time, a zirconium silicate layer 103 made of a ternary compound (specifically, $ZrSi_xO_y$, where x, y>0) of zirconium, silicon and oxygen, is formed at the interface between the silicon substrate 100 and the zirconium oxide layer 102.

Hereafter, how the zirconium silicate layer 103 is formed will be described in detail. First, an $O_2$ plasma produced by the discharge generated during the sputtering process causes the surface of the silicon substrate 100 and the surface of the metal target both to be oxidized. The zirconium oxide that has been formed on the metal target surface is then sputtered, such that the zirconium oxide is injected into the silicon oxide layer that has been formed on the silicon substrate 100 surface, and the zirconium oxide and the silicon oxide are mixed together. As a result, the zirconium silicate layer 103 is formed.

The present inventors found that the zirconium silicate layer 103 formed in this manner had a dielectric constant about twice as high as that of $SiO_2$. This means that in the case of forming a zirconium silicate layer having an extremely small EOT of about 1.5 nm, the zirconium silicate layer may have a relatively large physical thickness of about 3 nm.

Figure 2:
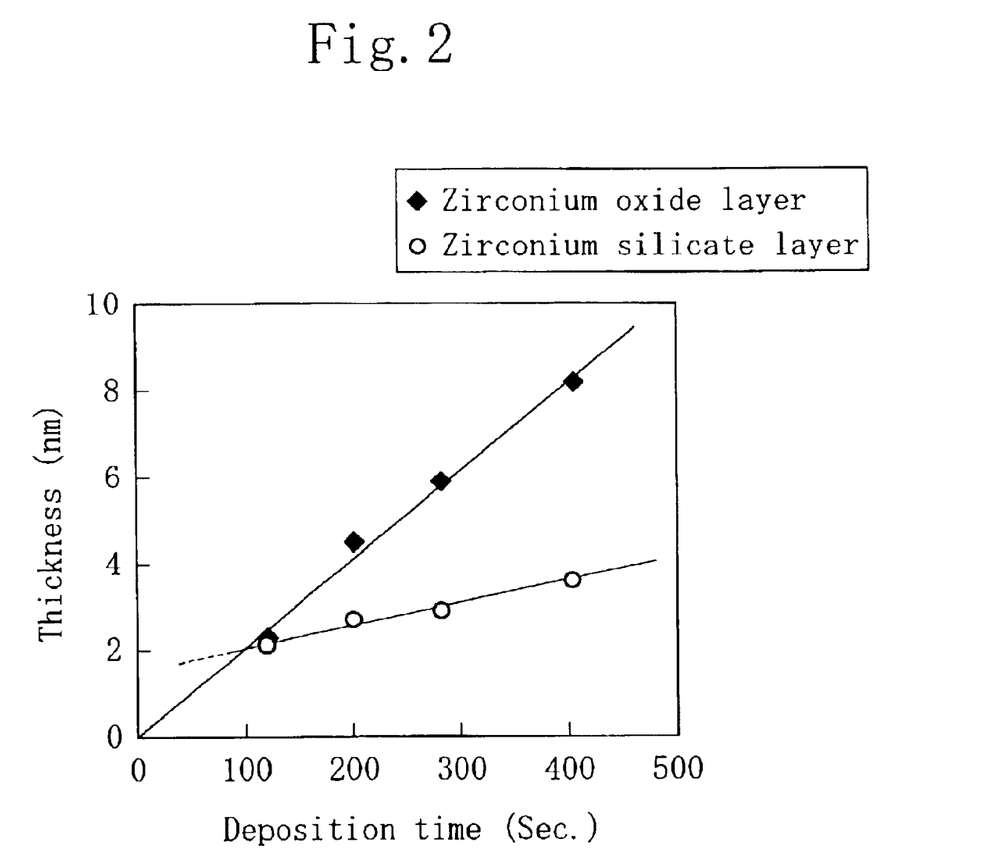
FIG. 2 is a graph illustrating relationship between deposition time for a zirconium oxide layer and the deposition thickness of a zirconium silicate layer in the semiconductor-device fabrication method in accordance with the first embodiment of the present invention.

The present inventors also found that, as shown in FIG. 2, the deposition thickness of the zirconium silicate layer 103 increased in proportion to the deposition time for the zirconium oxide layer 102. The results shown in FIG. 2 were obtained under the specific sputtering conditions that the pressure inside the chamber was 0.4 kPa, the discharge power was 200 W, and the Ar/$O_2$ flow rate ratio (which is a flow rate ratio per minute in a standard state) was 10/10 cc. In other words, the relationship between the deposition thickness of the zirconium oxide layer 102 and the deposition thickness of the zirconium silicate layer 103 can be changed by altering the sputtering conditions. Needless to say, by thus changing the relationship, the thickness configuration in the multilayer structure of the zirconium oxide layer 102 and the zirconium silicate layer 103 can be established at will. FIG. 2 also indicates, for reference, the relationship between the deposition time for and deposition thickness of the zirconium oxide layer 102.

Next, as shown in FIG. 1(b), the zirconium oxide layer 102 is removed with, e.g., a dilute hydrofluoric acid solution. In this process step, the etch rate of the zirconium silicate layer 103 being lower than that of the zirconium oxide layer 102 enables leaving only the zirconium silicate layer 103. In this manner, a gate insulating film 104 (see FIG. 1(c)) made of the zirconium silicate layer 103 can be formed.

Subsequently, as shown in FIG. 1(c), a gate electrode 105 is formed on the gate insulating film 104. Following this, a sidewall insulating film 106 is formed on both lateral faces of the gate electrode 105; and doped layers 107, which act as source and drain regions, are defined on both sides of the gate electrode 105 in the silicon substrate 100. An interlevel dielectric film 108 is then formed over the silicon substrate 100 as well as over the gate electrode 105 and like members. Thereafter, a wire 109 is formed on the interlevel dielectric film 108. Note that the wire 109 has plugs that are formed in the interlevel dielectric film 108 so as to be connected to the doped layers 107.

As described above, according to the first embodiment, the zirconium silicate layer 103 is formed on the silicon substrate 100, the zirconium oxide layer 102 is also formed on the zirconium silicate layer 103, and the zirconium oxide layer 102 is then removed, thereby forming the gate insulating film 104 made of the zirconium silicate layer 103. In this embodiment, it is ensured that the zirconium silicate layer 103 with a uniform thickness and a dielectric constant higher than that of $SiO_2$ can be formed by a reactive sputtering method in which a target made of zirconium is used, and the thickness of the zirconium silicate layer 103 can be easily and accurately adjusted by controlling the sputtering conditions. Accordingly, it is possible to obtain a gate insulating film 104 with small EOT and small leakage current, enabling realizing a low-power-consumption MOSFET having desired driving power.

It should be noted that although zirconium (Zr) is used as the material for the metal target in the first embodiment, another material from which a compound (oxide) having a high dielectric constant (higher than the dielectric constant of $SiO_2$) can be obtained by reactive sputtering may be used instead of zirconium. For example, a metal such as Hf, Ti, Ta, Al, Pr, Nd or La, or any alloy of these metals may be used. In the first embodiment, the metal target may contain oxygen or a small quantity of silicon.

Modified Example of First Embodiment

Hereafter, taking an n-type MOSFET as an example, a method for fabricating a semiconductor device in accordance with a modified example of the first embodiment of the present invention will be described.

The modified example of the first embodiment is different from the first embodiment in that a chemical vapor deposition method, instead of the reactive sputtering method, is used to form a zirconium silicate layer 103 and a zirconium oxide layer 102 in the process step shown in FIG. 1(a).

Specifically, after an isolation 101 is formed, an oxide film (silicon oxide layer) having a thickness of about 1 nm is formed on the surface of a silicon substrate 100 in an $H_2O$ ambient at high temperature, in the initial stage of a chemical vapor deposition process. Then, a zirconium oxide layer 102 is formed over the silicon substrate 100 by a chemical vapor deposition method using a gaseous mixture of $H_2O$ and $ZrCl_4$ as a source gas. In this process step, a reaction occurs between the source gas containing zirconium and the silicon oxide layer, thereby forming a zirconium silicate layer 103 made of a ternary compound of zirconium, silicon and oxygen at the interface between the silicon substrate 100 and the zirconium oxide layer 102. The zirconium silicate layer 103 formed in this manner has the same properties as in the case in which a reactive sputtering method is used (as in the first embodiment). Also, by changing the deposition conditions, such as the flow-rate ratio of the gaseous components included in the source gas, or the deposition temperature or the deposition time, the thickness configuration in the multilayer structure of the zirconium oxide layer 102 and the zirconium silicate layer 103 can be established at will.

Therefore, according to the modified example of the first embodiment, the same effects as in the first embodiment can be obtained.

Specifically, in accordance with the modified example of the first embodiment, the zirconium silicate layer 103 is formed on the silicon substrate 100, the zirconium oxide layer 102 is also formed on the zirconium silicate layer 103, and the zirconium oxide layer 102 is then removed, thereby forming the gate insulating film 104 made of the zirconium silicate layer 103. In this modified example, it is ensured that the zirconium silicate layer 103 with a uniform thickness and a dielectric constant higher than that of $SiO_2$ can be formed by a chemical vapor deposition method using a source gas containing zirconium, and the thickness of the zirconium silicate layer 103 can be easily and accurately adjusted by controlling the deposition conditions. Accordingly, it is possible to obtain a gate insulating film 104 with small EOT and small leakage current, making a low-power-consumption MOSFET having desired driving power a reality.

It should be noted that although the source gas containing zirconium (Zr) is used in the modified example of the first embodiment, a source gas containing another material from which a compound (oxide) having a high dielectric constant can be obtained by a chemical vapor deposition method may be used instead. For example, a source gas containing a metal such as Hf, Ti, Ta, Al, Pr, Nd or La, or any alloy of these metals may be used.

Further, as the chemical vapor deposition method in the modified example of the first embodiment, a routine thermal CVD method, for example, may be used, or an ALD (atomic layer deposition) process may also be used. In an ALD process, a metal oxide layer such as a zirconium oxide layer is formed by depositing molecular strata one after another by pulsed (intermittent) supply of a source gas. (See, for example, pp. 46–47 in "2000 Symposium on VLSI Technology: Digest of Technical Papers" by Dae-Gyu Park, et al.; or pp. 2207–2209 in "Applied Physics Letters, Volume 77 (Number 14), 2000 by Dae-Gyu Park, et al.) Use of an ALD process can serve to improve the controllability and uniformity of the thickness of a metal silicate layer such as a zirconium silicate layer.

Further, although a reactive sputtering method or a chemical vapor deposition method is used to form a metal silicate layer and a metal oxide layer in the first embodiment and the modified example of the first embodiment, the present invention is not limited thereto. Needless to say, any other film-forming method by which a high-quality metal silicate layer such as the zirconium silicate layer 103 can be formed may be used.

Second Embodiment

Hereafter, taking an n-type MOSFET as an example, a semiconductor device in accordance with a second embodiment of the present invention and a method for fabricating the same will be described with reference to the accompanying drawings.

Figure 3A:
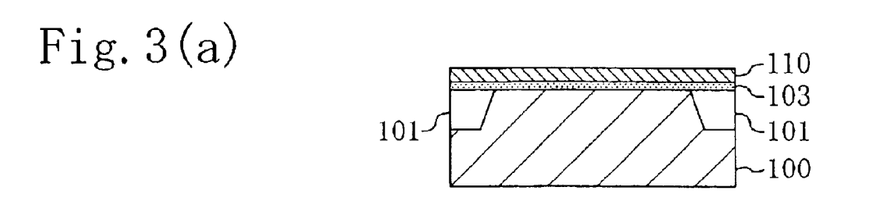
FIGS. 3(a) and 3(b) are cross-sectional views illustrating process steps of a method for fabricating a semiconductor device in accordance with a second embodiment of the present invention.
Figure 3B:
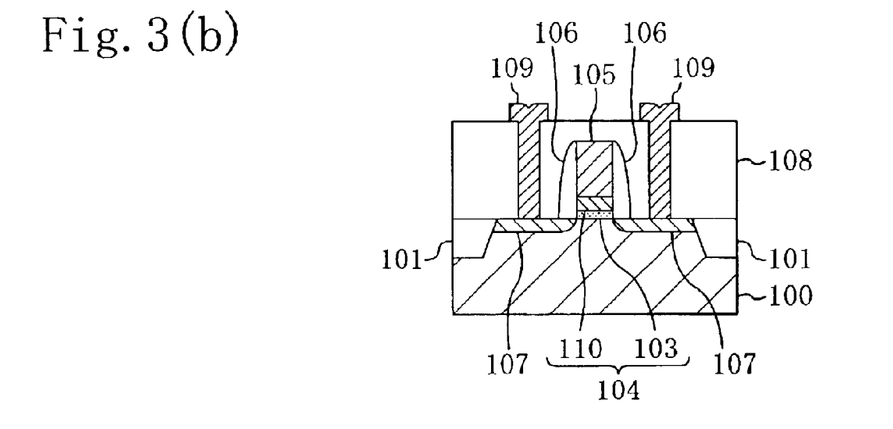

FIGS. 3(a) and 3(b) are cross-sectional views illustrating process steps of a method for fabricating the semiconductor device in the second embodiment.

The semiconductor device fabrication method in the second embodiment is characterized as follows: a metal silicate layer is formed on a silicon substrate, a metal oxide layer is also formed on the metal silicate layer, the metal oxide layer is then removed, and thereafter another metal oxide layer is formed, thereby forming a gate insulating film made of the metal silicate layer and said another metal oxide layer. In the second embodiment, until the process step shown in FIG. 1(b), the same process steps as in the first embodiment or the modified example thereof are performed.

Specifically, as shown in FIGS. 1(a) and 1(b), by a reactive sputtering method or a chemical vapor deposition method, a zirconium silicate layer 103 is formed on a silicon substrate 100 and a zirconium oxide layer 102 is also formed on the zirconium silicate layer 103. The zirconium oxide layer 102 is then removed in such a manner that only the zirconium silicate layer 103 is left.

Next, as shown in FIG. 3(a), a hafnium oxide layer (HfO$_2$ layer) 110 with a thickness of about 5 nm, which acts as a high-dielectric-constant material layer, is formed on the zirconium silicate layer 103 by, e.g., a reactive sputtering method. In this way, a gate insulating film 104 (see FIG. 3(b)) composed of the zirconium silicate layer 103 and the hafnium oxide layer 110 in a multilayer structure can be formed. The dielectric constant of the hafnium oxide layer 110 is higher than that of the zirconium oxide layer 102. Thus, the multilayer structure of the zirconium silicate layer 103 and the hafnium oxide layer 110 has a smaller EOT as compared to the multilayer structure of the zirconium silicate layer 103 and the zirconium oxide layer 102 when the multilayer structures have the same thickness.

Next, as shown in FIG. 3(b), a gate electrode 105 is formed on the gate insulating film 104. Thereafter, a sidewall insulating film 106 is formed on both lateral faces of the gate electrode 105; and doped layers 107, which act as source and drain regions, are defined on both sides of the gate electrode 105 in the silicon substrate 100. An interlevel dielectric film 108 is then formed over the silicon substrate 100 as well as over the gate electrode 105 and like members. Thereafter, a wire 109 is formed on the interlevel dielectric film 108. Note that the wire 109 has plugs that are formed in the interlevel dielectric film 108 so as to be connected to the doped layers 107.

As described above, according to the second embodiment, the zirconium silicate layer 103 is formed on the silicon substrate 100, the zirconium oxide layer 102 is also formed on the zirconium silicate layer 103, the zirconium oxide layer 102 is then removed, and thereafter the hafnium oxide layer 110 is formed, thereby forming the gate insulating film 104 made of the zirconium silicate layer 103 and the hafnium oxide layer 110. In this embodiment, the use of a reactive sputtering method or a chemical vapor deposition method, for example, enables the formation of a zirconium silicate layer 103 having a uniform thickness and a dielectric constant higher than the dielectric constant of SiO$_2$, and the thickness of the zirconium silicate layer 103 can also be easily adjusted by controlling the sputtering conditions or the deposition conditions, for example. Further, since the hafnium oxide layer 110 is separately formed on the zirconium silicate layer 103, the hafnium oxide layer 110 can be formed as designed without taking reaction with the silicon substrate 100 into account. Accordingly, with the multilayer structure of the zirconium silicate layer 103 and the hafnium oxide layer 110, the gate insulating film 104 with small EOT and small leakage current can be obtained, which enables realizing a low-power-consumption MOSFET having desired driving power.

Moreover, according to the second embodiment, the multilayer structure of the zirconium silicate layer 103 and the hafnium oxide layer 110 can be easily formed to have a desired thickness configuration. This enables the design of a gate insulating film 104 in accordance with the functions called for in a MOSFET. For example, designing a gate insulating film targeted at compatibility between high driving power and lower power consumption is facilitated.

It should be noted that in the second embodiment, the zirconium silicate layer 103 and the zirconium oxide layer 102 are preferably formed by a reactive sputtering method using a target made of zirconium or by a chemical vapor deposition method using a source gas containing zirconium. It is then ensured that the zirconium silicate layer 103 with a uniform thickness and a dielectric constant higher than that of SiO$_2$ can be formed, and the thickness of the zirconium oxide layer 102 can be accurately adjusted by controlling the sputtering conditions or the deposition conditions. In the second embodiment, a conventional thermal CVD method or an ALD process, for example, may be used as the chemical vapor deposition method. In the case in which an ALD process is employed, the controllability and uniformity of the thickness of the zirconium silicate layer 103 can be improved. Further, it goes without saying that any other film-forming method by which a zirconium silicate layer 103 of quality can be formed may be used instead of the reactive sputtering method or the chemical vapor deposition method.

It should be noted that although the zirconium silicate layer 103 is used as the metal silicate layer functioning as the lower layer of the gate insulating film 104 in the second embodiment, the present invention is not limited thereto. The metal silicate layer preferably contains a metal such as Zr, Hf, Ti, Al, Pr, Nd or La, or any alloy of these metals. It is then ensured that the dielectric constant of the metal silicate layer is higher than the dielectric constant of SiO$_2$.

Further, although the hafnium oxide layer 110 is used as said another metal oxide layer functioning as the upper layer of the gate insulating film 104 in the second embodiment, the present invention is not limited thereto. Said another metal oxide layer preferably contains a metal such as Zr, Hf, Ti, Al, Pr, Nd or La, or any alloy of these metals. It should be noted, however, that a metal contained in the metal silicate layer that serves as the lower layer of the gate insulating film 104 is preferably different from a metal contained in said another metal oxide layer.

Furthermore, a metal contained in the metal silicate layer functioning as the lower layer of the gate insulating film 104 is preferably selected in such a manner that the metal silicate layer is thermally stable at the interface with the substrate and does not cause creation of great strain in the silicon crystal, which would result in deterioration of mobility in the silicon crystal. In addition, a metal contained in said another metal oxide layer functioning as the upper layer of the gate insulating film 104 is preferably selected in such a manner that the dielectric constant of said another metal oxide layer is higher than the dielectric constant of the metal oxide layer containing the same kind of metal that the metal silicate layer contains.

Third Embodiment

Hereafter, taking an n-type MOSFET as an example, a semiconductor device in accordance with a third embodiment of the present invention and a method for fabricating the same will be described with reference to the accompanying drawings.

FIGS. 4(a) through 4(e) are cross-sectional views illustrating process steps of a method for fabricating the semiconductor device in the third embodiment.

The semiconductor device fabrication method in the third embodiment is characterized as follows: a metal silicate layer is formed on a silicon substrate, a metal oxide layer is also formed on the metal silicate layer, and the metal oxide layer is then partially removed, thereby forming a first gate insulating film made of the metal silicate layer, and a second gate insulating film made of the metal silicate layer and the metal oxide layer. In the third embodiment, a reactive sputtering method, for example, is used to form the metal silicate layer and the metal oxide layer.

Figure 4A:
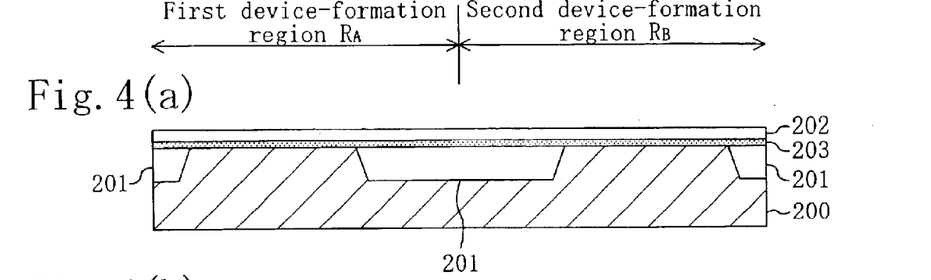
FIGS. 4(a) through 4(e) are cross-sectional views illustrating process steps of a method for fabricating a semiconductor device in accordance with a third embodiment of the present invention.

Specifically, as shown in FIG. 4(a), an isolation 201 is formed in, e.g., a p-type silicon substrate 200 by a known method, thereby defining a first device-formation region $R_A$ and a second device-formation region $R_B$. A metal target made of, e.g., zirconium (Zr) is then subjected to a reactive sputtering performed in a gaseous mixture of, e.g., Ar and $O_2$ gases, thereby depositing, as a high-dielectric-constant material layer, a zirconium oxide layer ($ZrO_2$ layer) 202 with a thickness of, e.g., some 5 nm over the first device-formation region $R_A$ and the second device-formation region $R_B$. At this time, a zirconium silicate layer 203 made of a ternary compound (specifically, $ZrSi_xO_y$, where x, y>0) of zirconium, silicon and oxygen, is formed at the interface between the silicon substrate 200 and the zirconium oxide layer 202. Note that the specific process steps for forming, and the characteristics of the zirconium silicate layer 203 are the same with the zirconium silicate layer 103 in the first embodiment.

Figure 4B:
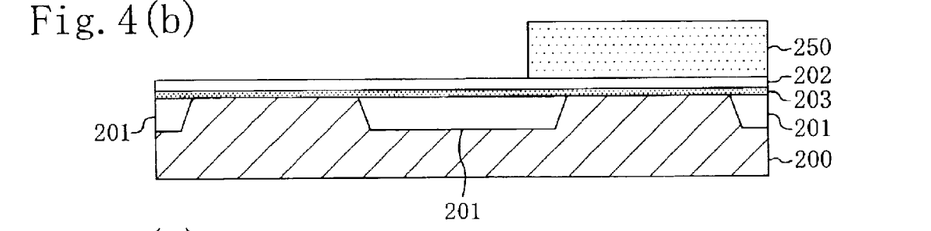
Figure 4C:
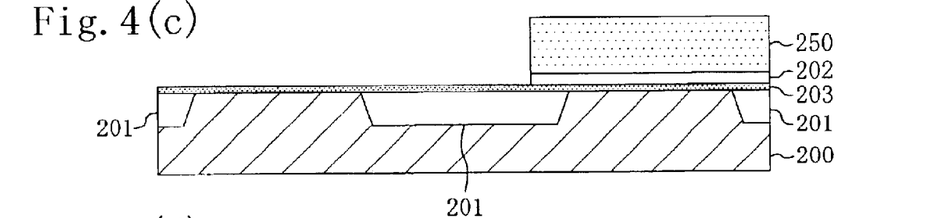

Next, as shown in FIG. 4(b), a resist pattern 250 is formed on part of the zirconium oxide layer 202 located in the second device-formation region $R_B$. Thereafter, as shown in FIG. 4(c), using the resist pattern 250 as a mask, part of the zirconium oxide layer 202 located in the first device-formation region $R_A$ is removed with, e.g., a dilute hydrofluoric acid solution. In this process step, the etch rate of the zirconium silicate layer 203 being lower than that of the zirconium oxide layer 202 enables leaving only the zirconium silicate layer 203 in the first device-formation region $R_A$. In this manner, a first gate insulating film 204A (see FIG. 4(e)) made of the zirconium silicate layer 203 can be formed in the first device-formation region $R_A$, and a second gate insulating film 204B (see FIG. 4(e)) made of the zirconium silicate layer 203 and the zirconium oxide layer 202 can also be formed in the second device-formation region $R_B$.

Figures 4D, 4E:
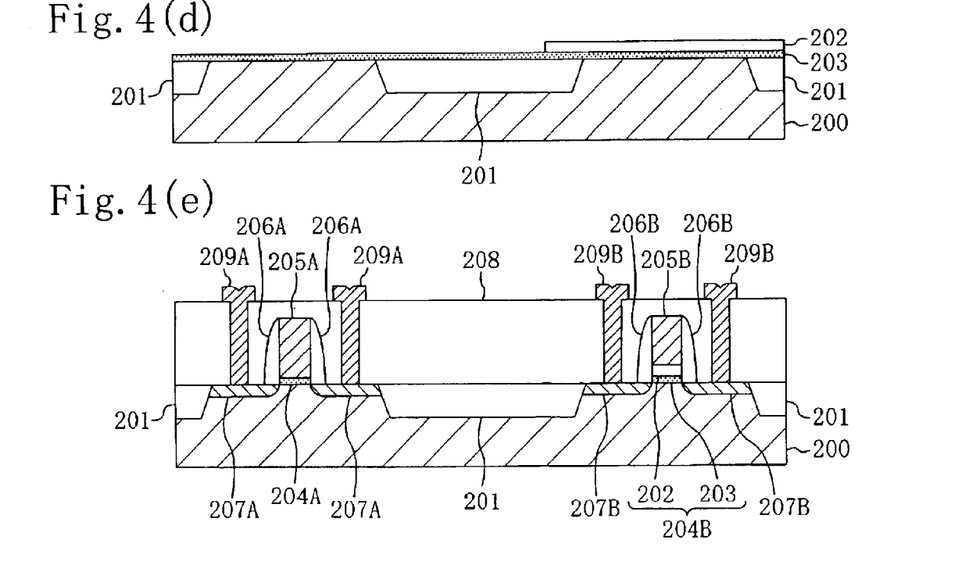

Subsequently, after the resist pattern 250 is removed as shown in FIG. 4(d), a first gate electrode 205A is formed on the first gate insulating film 204A and a second gate electrode 205B is also formed on the second gate insulating film 204B as shown in FIG. 4(e). Following this, a first sidewall insulating film 206A is formed on both lateral faces of the first gate electrode 205A, and a second sidewall insulating film 206B is also formed on both lateral faces of the second gate electrode 205B. Further, first doped layers 207A, which act as source and drain regions, are defined on both sides of the first gate electrode 205A in the silicon substrate 200, and second doped layers 207B, which act as source and drain regions, are also defined on both sides of the second gate electrode 205B in the silicon substrate 200. An interlevel dielectric film 208 is then formed over the silicon substrate 200 as well as over the first and second gate electrodes 205A and 205B and like members. Thereafter, a first wire 209A and a second wire 209B are formed on the interlevel dielectric film 208. Note that the first wire 209A has plugs that are formed in the interlevel dielectric film 208 so as to be connected to the first doped layers 207A, and the second wire 209B has plugs that are formed in the interlevel dielectric film 208 so as to be connected to the second doped layers 207B.

As described above, according to the third embodiment, the zirconium silicate layer 203 is formed on the silicon substrate 200, the zirconium oxide layer 202 is also formed on the zirconium silicate layer 203, and the zirconium oxide layer 202 is partially removed, thereby forming the first gate insulating film 204A made of the zirconium silicate layer 203, and the second gate insulating film 204B made of the zirconium silicate layer 203 and the zirconium oxide layer 202. In other words, the third embodiment is multi-gate insulating film technology in which the single layer structure of the zirconium silicate layer 203 is used as a thin gate insulting film, and the multilayer structure of the zirconium silicate layer 203 and the zirconium oxide layer 202 is used as a thick gate insulating film. Also, in the third embodiment, it is ensured that the zirconium silicate layer 203 with a uniform thickness and a dielectric constant higher than that of $SiO_2$ can be formed by a reactive sputtering method in which a target made of zirconium is used, and the thickness of the zirconium silicate layer 203 can be easily and accurately adjusted by controlling the sputtering conditions. Accordingly, because small EOT and small leakage current can be realized in the thin gate insulating film (the first gate insulating film 204A), increase in the gate leakage current can be prevented when the multi-gate insulating film technology is used, enabling the formation of a low-power consumption system LSI. Further, the first gate insulating film 204A enables realizing a MOSFET in which priority is given to increase in the driving power, while the second gate insulating film 204B enables realizing a MOSFET in which priority is given to decrease in the consumption power. As a result, a system LSI in which high driving power and low power consumption are compatible with each other can be realized.

It should be noted that although zirconium (Zr) is used as the material for the metal target in the third embodiment, another material from which a compound (oxide) having a high dielectric constant (higher than the dielectric constant of $SiO_2$) can be obtained by reactive sputtering may be used instead of zirconium. For example, a metal such as Hf, Ti, Ta, Al, Pr, Nd or La, or any alloy of these metals may be used. In the third embodiment, the metal target may contain oxygen or a small quantity of silicon.

In addition, in the third embodiment, it is preferable that a MOSFET including the first gate insulating film 204A is used in an internal circuit, while a MOSFET including the second gate insulating film 204B is used in a peripheral circuit. This enables realizing a system LSI including a high-driving-power, low-power-consumption internal circuit and a low-power-consumption peripheral circuit.

Furthermore, in the third embodiment, it is preferable that a MOSFET including the first gate insulating film 204A is used in a logic section, while a MOSFET including the second gate insulating film 204B is used in a DRAM section. This enables realizing a system LSI including a high-driving-power, low-power-consumption logic section and a low-power-consumption DRAM section.

Modified Example of Third Embodiment

Hereafter, taking an n-type MOSFET as an example, a method for fabricating a semiconductor device in accordance with a modified example of the third embodiment of the present invention will be described.

The modified example of the third embodiment is different from the third embodiment in that a chemical vapor deposition method, instead of the reactive sputtering method, is used to form a zirconium silicate layer 203 and a zirconium oxide layer 202 in the process step shown in FIG. 4(a).

Specifically, after an isolation 201 is formed, an oxide film (silicon oxide layer) having a thickness of about 1 nm is formed on the surface of a silicon substrate 200 in an $H_2O$ ambient at high temperature, in the initial stage of a chemical vapor deposition process. Then, a zirconium oxide layer 202 is formed over the silicon substrate 200 by a chemical vapor deposition method using a gaseous mixture of $H_2O$ and $ZrCl_4$ as a source gas. In this process step, a reaction occurs between the source gas containing zirconium and the silicon oxide layer, thereby forming a zirconium silicate layer 203 made of a ternary compound of zirconium, silicon and oxygen at the interface between the silicon substrate 200 and the zirconium oxide layer 202. The zirconium silicate layer 203 formed in this manner has the same properties as in the case in which a reactive sputtering method is used (as in the third embodiment). Also, by changing the deposition conditions, such as the flow-rate ratio of the gaseous components included in the source gas, or the deposition temperature or the deposition time, the thickness configuration in the multilayer structure of the zirconium oxide layer 202 and the zirconium silicate layer 203 can be established at will.

Therefore, according to the modified example of the third embodiment, the same effects as in the third embodiment can be obtained.

Specifically, in accordance with the modified example of the third embodiment, the zirconium silicate layer 203 is formed on the silicon substrate 200, the zirconium oxide layer 202 is also formed on the zirconium silicate layer 203, and the zirconium oxide layer 202 is then partially removed, thereby forming a first gate insulating film 204A made of the zirconium silicate layer 203, and a second gate insulating film 204B made of the zirconium silicate layer 203 and the zirconium oxide layer 202. In other words, the modified example of the third embodiment is multi-gate insulating film technology in which the single layer structure of the zirconium silicate layer 203 is used as a thin gate insulting film, and the multilayer structure of the zirconium silicate layer 203 and the zirconium oxide layer 202 is used as a thick gate insulating film. In the modified example of the third embodiment, it is ensured that the zirconium silicate layer 203 with a uniform thickness and a dielectric constant higher than that of $SiO_2$ can be formed by a chemical vapor deposition method using a source gas containing zirconium, and the thickness of the zirconium silicate layer 203 can be easily and accurately adjusted by controlling the deposition conditions. Accordingly, because small EOT and small leakage current can be realized in the thin gate insulating film (the first gate insulating film 204A), increase in the gate leakage current can be prevented when the multi-gate insulating film technology is used, enabling the formation of a low-power consumption system LSI. Further, with the first gate insulating film 204A, a MOSFET in which priority is given to increase in the driving power can be realized, while with the second gate insulating film 204B, a MOSFET in which priority is given to decrease in the consumption power can be realized. Consequently, a system LSI in which high driving power and low power consumption are compatible with each other can be realized.

It should be noted that although the source gas containing zirconium (Zr) is used in the modified example of the third embodiment, a source gas containing another material from which a compound (oxide) having a high dielectric constant can be obtained by a chemical vapor deposition method may be used instead. For example, a source gas containing a metal such as Hf, Ti, Ta, Al, Pr, Nd or La, or any alloy of these metals may be used.

Further, as the chemical vapor deposition method in the modified example of the third embodiment, a routine thermal CVD method, for example, may be used, or an ALD process may also be used. In an ALD process, a metal oxide layer such as a zirconium oxide layer is formed by depositing molecular strata one after another by pulsed supply of a source gas. Use of an ALD process can serve to improve the controllability and uniformity in a metal silicate layer such as a zirconium silicate layer.

Further, although a reactive sputtering method or a chemical vapor deposition method is used to form a metal silicate layer and a metal oxide layer in the third embodiment and the modified example of the third embodiment, the present invention is not limited thereto. Needless to say, any other film-forming method by which a high-quality metal silicate layer such as the zirconium silicate layer 203 can be formed may be used.

Fourth Embodiment

Hereafter, taking an n-type MOSFET as an example, a semiconductor device in accordance with a fourth embodiment of the present invention and a method for fabricating the same will be described with reference to the accompanying drawings.

Figure 5A:
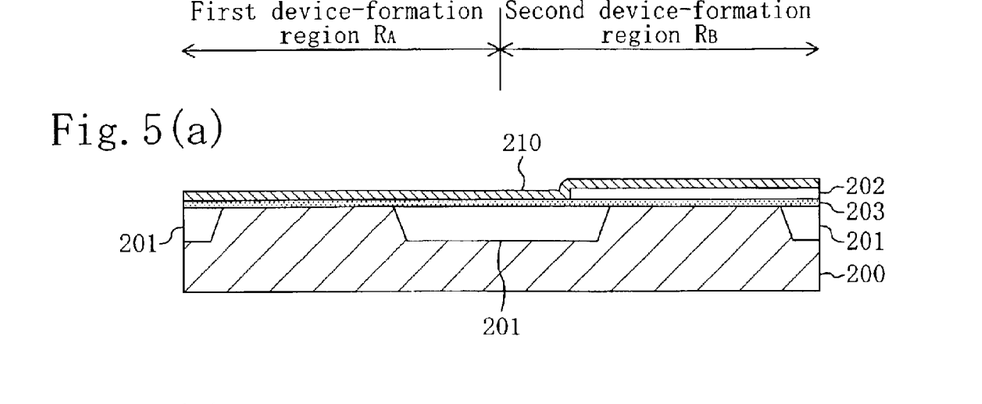
FIGS. 5(a) and 5(b) are cross-sectional views illustrating process steps of a method for fabricating a semiconductor device in accordance with a fourth embodiment of the present invention.
Figure 5B:
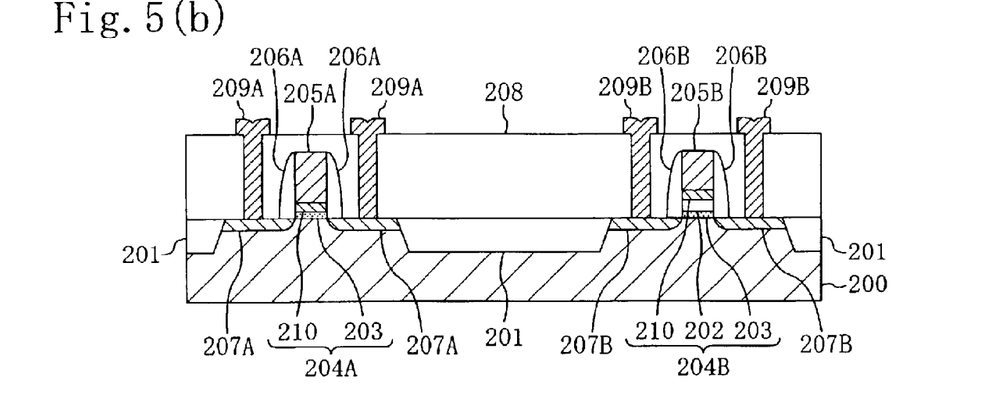

FIGS. 5(a) and 5(b) are cross-sectional views illustrating process steps of a method for fabricating the semiconductor device in the fourth embodiment.

The semiconductor device fabrication method in the fourth embodiment is characterized as follows: a metal silicate layer is formed on a silicon substrate, a metal oxide layer is also formed on the metal silicate layer, the metal oxide layer is then partially removed, and thereafter another metal oxide layer is formed, thereby forming a first gate insulating film made of the metal silicate layer and said another metal oxide layer, and a second gate insulating film made of the metal silicate layer, the metal oxide layer and said another meal oxide layer. In the fourth embodiment, until the process step shown in FIG. 4(d), the same process steps as in the third embodiment or the modified example thereof are performed.

Specifically, as shown in FIGS. 4(a) through 4(d), by, e.g., a reactive sputtering method or a chemical vapor deposition method, a zirconium silicate layer 203 is formed on a silicon substrate 200, and a zirconium oxide layer 202 is also formed on the zirconium silicate layer 203. The zirconium oxide layer 202 is then removed in such a manner that only the zirconium silicate layer 203 is left in the first device-formation region $R_A$, while the multilayer structure of the zirconium silicate layer 203 and the zirconium oxide layer 202 is left in the second device-formation region $R_B$.

Next, as shown in FIG. 5(a), a hafnium oxide layer (HfO$_2$ layer) 210 with a thickness of about 5 nm is formed as a high-dielectric-constant material layer over the entire surface of the silicon substrate 200 by, e.g., a reactive sputtering method. In this manner, a first gate insulating film 204A (see FIG. 5(b)) made of the multilayer structure of the zirconium silicate layer 203 and the hafnium oxide layer 210 can be formed in the first device-formation region $R_A$, while a second gate insulating film 204B (see FIG. 5(b)) made of the multilayer structure of the zirconium silicate layer 203, the zirconium oxide layer 202 and the hafnium oxide layer 210 can be formed in the second device-formation region $R_B$. In this case, the dielectric constant of the hafnium oxide layer 210 is higher than that of the zirconium oxide layer 202. Thus, the multilayer structure of the zirconium silicate layer 203 and the hafnium oxide layer 210 has a smaller EOT as compared to the multilayer structure of the zirconium silicate layer 203 and the zirconium oxide layer 202 when the multilayer structures have the same thickness.

Next, as shown in FIG. 5(b), a first gate electrode 205A is formed on the first gate insulating film 204A, and a second gate electrode 205B is also formed on the second gate insulating film 204B. Following this, a first sidewall insulating film 206A is formed on both lateral faces of the first gate electrode 205A, and a second sidewall insulating film 206B is also formed on both lateral faces of the second gate electrode 205B. Further, first doped layers 207A, which act as source and drain regions, are defined on both sides of the first gate electrode 205A in the silicon substrate 200, and second doped layers 207B, which act as source and drain regions, are also defined on both sides of the second gate electrode 205B in the silicon substrate 200. An interlevel dielectric film 208 is then formed over the silicon substrate 200 as well as over the first and second gate electrodes 205A and 205B and like members. Thereafter, a first wire 209A and a second wire 209B are formed on the interlevel dielectric film 208. Note that the first wire 209A has plugs that are formed in the interlevel dielectric film 208 so as to be connected to the first doped layers 207A, while the second wire 209B has plugs that are formed in the interlevel dielectric film 208 so as to be connected to the second doped layers 207B.

As described above, according to the fourth embodiment, the zirconium silicate layer 203 is formed on the silicon substrate 200, the zirconium oxide layer 202 is also formed on the zirconium silicate layer 203, the zirconium oxide layer 202 is then partially removed, and thereafter the hafnium oxide layer 210 is formed, thereby forming the first gate insulating film 204A made of the zirconium silicate layer 203 and the hafnium oxide layer 210, and the second gate insulating film 204B made of the zirconium silicate layer 203, the zirconium oxide layer 202 and the hafnium oxide layer 210. In other words, the fourth embodiment is multi-gate insulating film technology in which the multilayer structure of the zirconium silicate layer 203 and the hafnium oxide layer 210 is used as a thin gate insulting film, and the multilayer structure of the zirconium silicate layer 203, the zirconium oxide layer 202 and the hafnium oxide layer 210 is used as a thick gate insulating film. Also, in the fourth embodiment, it is ensured that the zirconium silicate layer 203 with a uniform thickness and a dielectric constant higher than that of SiO$_2$ can be formed using, e.g., a reactive sputtering method or a chemical vapor deposition method, and the thickness of the zirconium silicate layer 203 can be easily adjusted by controlling the sputtering conditions or the deposition conditions, for example. Further, since the hafnium oxide layer 210 is separately formed on the zirconium silicate layer 203 or the zirconium oxide layer 202, the hafnium oxide layer 210 can be formed as designed without taking reaction with the silicon substrate 200 into account. Accordingly, because the multilayer structure of the zirconium silicate layer 203 and the hafnium oxide layer 210 allows small EOT and small leakage current to be realized in the thin gate insulating film (the first gate insulating film 204A), increase in the gate leakage current can be prevented when the multi-gate insulating film technology is used, enabling the formation of a low-power consumption system LSI. Further, with the first gate insulating film 204A, a MOSFET in which priority is given to increase in the driving power can be realized, while with the second gate insulating film 204B, a MOSFET in which priority is given to decrease in the consumption power can be realized. As a result, a system LSI in which high driving power and low power consumption are compatible with each other can be realized.

Moreover, according to the fourth embodiment, the multilayer structure of the zirconium silicate layer 203 and the hafnium oxide layer 210, or the multilayer structure of the zirconium silicate layer 203, the zirconium oxide layer 202 and the hafnium oxide layer 210 can be easily formed to have a desired thickness configuration. This enables the design of a first gate insulating film 204A or a second gate insulating film 204B in accordance with the functions called for in a MOSFET. For example, designing a gate insulating film targeted at compatibility between high driving power and lower power consumption is facilitated.

Note that it is preferable that the zirconium silicate layer 203 and the zirconium oxide layer 202 are formed by a reactive sputtering method using a target made of zirconium or by a chemical vapor deposition method using a source gas containing zirconium. It is then ensured that the zirconium silicate layer 203 with a uniform thickness and a dielectric constant higher than that of SiO$_2$ can be formed, and the thickness of the zirconium oxide layer 202 can be accurately adjusted by controlling the sputtering conditions or the deposition conditions. In this embodiment, a routine thermal CVD method or an ALD process, for example, may be used as the chemical vapor deposition method. Use of an ALD process can serve to improve the controllability and uniformity of the thickness of the zirconium silicate layer 203. Needless to say, any other film-forming method by which a high-quality zirconium silicate layer 203 can be formed may be used instead of the reactive sputtering method or the chemical vapor deposition method.

It should be noted that although the zirconium silicate layer 203 is used as the metal silicate layer functioning as the lower layer of the first or second gate insulating film 204A or 204B in the fourth embodiment, the present invention is not limited thereto. The metal silicate layer preferably contains a metal such as Zr, Hf, Ti, Al, Pr, Nd or La, or any alloy of these metals. It is then ensured that the dielectric constant of the metal silicate layer is higher than that of SiO$_2$.

Further, although the hafnium oxide layer 210 is used as said another metal oxide layer functioning as the upper layer of the first or second gate insulating film 204A or 204B in the fourth embodiment, the present invention is not limited thereto. Said another metal oxide layer preferably contains a metal such as Zr, Hf, Ti, Al, Pr, Nd or La, or any alloy of these metals. It should be noted, however, that a metal contained in the metal silicate layer that serves as the lower layer of the first or second gate insulating film 204A or 204B is preferably different from a metal contained in said another metal oxide layer.

Furthermore, a metal contained in the metal silicate layer functioning as the lower layer of the first or second gate insulating film 204A or 204B is preferably selected in such a manner that the metal silicate layer is thermally stable at the interface with the substrate and does not cause creation of great strain in the silicon crystal, which would result in deterioration of mobility in the silicon crystal. In addition, a metal contained in said another metal oxide layer functioning as the upper layer of the first or second gate insulating film 204A or 204B is preferably selected in such a manner that the dielectric constant of said another metal oxide layer is higher than the dielectric constant of the metal oxide layer containing the same kind of metal that the metal silicate layer contains.

In addition, in the fourth embodiment, it is preferable that a MOSFET including the first gate insulating film 204A is used in an internal circuit, while a MOSFET including the second gate insulating film 204B is used in a peripheral circuit. It is then possible to realize a system LSI including a high-driving-power, low-power-consumption internal circuit and a low-power-consumption peripheral circuit.

Furthermore, in the fourth embodiment, it is preferable that a MOSFET including the first gate insulating film 204A is used in a logic section, while a MOSFET including the second gate insulating film 204B is used in a DRAM section. It is then possible to realize a system LSI including a high-driving-power, low-power-consumption logic section and a low-power-consumption DRAM section.

What is claimed is:

1. A method for fabricating a semiconductor device characterized by comprising the steps of:
   (a) forming a metal silicate layer containing at least a first metal on a silicon substrate, and also forming a metal oxide layer containing the first metal on the metal silicate layer;
   (b) removing the metal oxide layer, thereby forming a gate insulating film made of the metal silicate layer; and
   (c) forming a gate electrode on the gate insulating film.

2. The method for fabricating a semiconductor device of claim 1, characterized in that the step (a) includes the step (d) of forming the metal silicate layer and the metal oxide layer by reactive sputtering in which a target containing at least the first metal is used.

3. The method for fabricating a semiconductor device of claim 1, characterized in that the step (a) includes the step (e) of forming the metal silicate layer and the metal oxide layer by chemical vapor deposition in which a source gas containing at least the first metal is used.

4. The method for fabricating a semiconductor device of claim 3, characterized in that the step (e) includes the step of forming the metal oxide layer in molecular strata deposited one after another by pulsed supply of the source gas.

5. The method for fabricating a semiconductor device of claim 1, characterized in that the first metal is one metal among the group of metals consisting of Hf, Zr, Ti, Ta, Al, Pr, Nd and La, or an alloy made of two or more metals among the group of metals.

6. The method for fabricating a semiconductor device of claim 1, characterized in that the first metal is Zr.

7. A method for fabricating a semiconductor device characterized by comprising the steps of:
   (a) forming a metal silicate layer containing at least a first metal on a silicon substrate, and also forming a metal oxide layer containing the first metal on the metal silicate layer;
   (b) removing the metal oxide layer, and then forming another metal oxide layer containing a second metal different from the first metal over the silicon substrate, thereby forming a gate insulating film made of the metal silicate layer and said another metal oxide layer; and
   (c) forming a gate electrode on the gate insulating film.

8. The method for fabricating a semiconductor device of claim 7, characterized in that the step (a) includes the step (d) of forming the metal silicate layer and the metal oxide layer by reactive sputtering in which a target containing at least the first metal is used.

9. The method for fabricating a semiconductor device of claim 7, characterized in that the step (a) includes the step (e) of forming the metal silicate layer and the metal oxide layer by chemical vapor deposition in which a source gas containing at least the first metal is used.

10. The method for fabricating a semiconductor device of claim 9, characterized in that the step (e) includes the step of forming the metal oxide layer in molecular strata deposited one after another by pulsed supply of the source gas.

11. The method for fabricating a semiconductor device of claim 7, characterized in that the first metal is one metal among the group of metals consisting of Hf, Zr, Ti, Ta, Al, Pr, Nd and La, or an alloy made of two or more metals among the group of metals.

12. The method for fabricating a semiconductor device of claim 7, characterized in that the first metal is Zr and the second metal is Hf.

13. A method for fabricating a semiconductor device characterized by comprising the steps of:
   (a) forming a metal silicate layer containing at least a first metal in a first device-formation region and a second device-formation region on a silicon substrate, and also forming a metal oxide layer containing the first metal on the metal silicate layer;
   (b) removing part of the metal oxide layer located in the first device-formation region, thereby forming a first gate insulating film made of the metal silicate layer in the first device-formation region, and also forming a second gate insulating film made of the metal silicate layer and the metal oxide layer in the second device-formation region; and
   (c) forming a first gate electrode on the first gate insulating film, and also forming a second gate electrode on the second gate insulating film.

14. The method for fabricating a semiconductor device of claim 13, characterized in that the step (a) includes the step (d) of forming the metal silicate layer and the metal oxide layer by reactive sputtering in which a target containing at least the first metal is used.

15. The method for fabricating a semiconductor device of claim 13, characterized in that the step (a) includes the step (e) of forming the metal silicate layer and the metal oxide layer by chemical vapor deposition in which a source gas containing at least the first metal is used.

16. The method for fabricating a semiconductor device of claim 15, characterized in that the step (e) includes the step of forming the metal oxide layer in molecular strata deposited one after another by pulsed supply of the source gas.

17. The method for fabricating a semiconductor device of claim 13, characterized in that the first metal is one metal among the group of metals consisting of Hf, Zr, Ti, Ta, Al, Pr, Nd and La, or an alloy made of two or more metals among the group of metals.

18. The method for fabricating a semiconductor device of claim 13, characterized in that the first metal is Zr.

19. A method for fabricating a semiconductor device characterized by comprising the steps of:

(a) forming a metal silicate layer containing at least a first metal in a first device-formation region and a second device-formation region on a silicon substrate, and also forming a metal oxide layer containing the first metal on the metal silicate layer;

(b) removing part of the metal oxide layer located in the first device-formation region, and then forming another metal oxide layer containing a second metal different from the first metal over the first device-formation region and the second device-formation region, thereby forming in the first device-formation region a first gate insulating film made of the metal silicate layer and said another metal oxide layer, and also forming in the second device-formation region a second gate insulating film made of the metal silicate layer, the metal oxide layer and said another metal oxide layer; and (c) forming a first gate electrode on the first gate insulating film, and also forming a second gate electrode on the second gate insulating film.

20. The method for fabricating a semiconductor device of claim 19, characterized in that the step (a) includes the step (d) of forming the metal silicate layer and the metal oxide layer by reactive sputtering in which a target containing at least the first metal is used.

21. The method for fabricating a semiconductor device of claim 19, characterized in that the step (a) includes the step (e) of forming the metal silicate layer and the metal oxide layer by chemical vapor deposition in which a source gas containing at least the first metal is used.

22. The method for fabricating a semiconductor device of claim 21, characterized in that the step (e) includes the step of forming the metal oxide layer in molecular strata deposited one after another by pulsed supply of the source gas.

23. The method for fabricating a semiconductor device of claim 19, characterized in that the first metal is one metal among the group of metals consisting of Hf, Zr, Ti, Ta, Al, Pr, Nd and La, or an alloy made of two or more metals among the group of metals.

24. The method for fabricating a semiconductor device of claim 19, characterized in that the first metal is Zr and the second metal is Hf.

25. A semiconductor device characterized by comprising a MOSFET including a gate insulating film formed by sequentially stacking a metal silicate layer containing a first metal and a metal oxide layer containing a second metal different from the first metal.

26. The semiconductor device of claim 25, characterized in that the first metal is one metal among the group of metals consisting of Hf, Zr, Ti, Ta, Al, Pr, Nd and La, or an alloy made of two or more metals among the group of metals.

27. A semiconductor device characterized by comprising:

a first MOSFET including a first gate insulating film made of a metal silicate layer containing a first metal, and a second MOSFET including a second gate insulating film formed by sequentially stacking the metal silicate layer and a metal oxide layer containing the first metal.

28. The semiconductor device of claim 27, characterized in that the first metal is one metal among the group of metals consisting of Hf, Zr, Ti, Ta, Al, Pr, Nd and La, or an alloy made of two or more metals among the group of metals.

29. The semiconductor device of claim 27, characterized in that the first MOSFET is used in an internal circuit, while the second MOSFET is used in a peripheral circuit.

30. The semiconductor device of claim 27, characterized in that the first MOSFET is used in a logic section, while the second MOSFET is used in a DRAM section.

31. A semiconductor device characterized by comprising:

a first MOSFET including a first gate insulating film formed by sequentially stacking a metal silicate layer containing a first metal and a metal oxide layer containing a second metal different from the first metal, and a second MOSFET including a second gate insulating film formed by sequentially stacking the metal silicate layer, a metal oxide layer containing the first metal, and the metal oxide layer containing the second metal.

32. The semiconductor device of claim 31, characterized in that the first metal is one metal among the group of metals consisting of Hf, Zr, Ti, Ta, Al, Pr, Nd and La, or an alloy made of two or more metals among the group of metals.

33. The semiconductor device of claim 31, characterized in that the first MOSFET is used in an internal circuit, while the second MOSFET is used in a peripheral circuit.

34. The semiconductor device of claim 31, characterized in that the first MOSFET is used in a logic section, while the second MOSFET is used in a DRAM section.

* * * * *

UNITED STATES PATENT AND TRADEMARK OFFICE
CERTIFICATE OF CORRECTION

PATENT NO.   : 6,812,101 B2
DATED        : November 2, 2004
INVENTOR(S)  : Masaru Moriwaki et al.

It is certified that error appears in the above-identified patent and that said Letters Patent is hereby corrected as shown below:

<u>Title page,</u>
After item [65], add the following:
-- [30] Foreign Application Priorty Data
April 2, 2001 (JP) ................ P2001-102908 --

Signed and Sealed this

Nineteenth Day of April, 2005

JON W. DUDAS
*Director of the United States Patent and Trademark Office*